United States Patent [19]
Uomi et al.

[11] Patent Number: 5,132,981
[45] Date of Patent: Jul. 21, 1992

[54] SEMICONDUCTOR OPTICAL DEVICE

[75] Inventors: Kazuhisa Uomi, Hachioji; Shinji Sasaki, Komoro; Tomonobu Tsuchiya, Kodaira; Naoki Chinone, Chofu; Tsukuru Ohtoshi, Kokubunji, all of Japan

[73] Assignee: Hitachi, Ltd., Tokyo, Japan

[21] Appl. No.: 529,245

[22] Filed: May 25, 1990

[30] Foreign Application Priority Data

May 31, 1989 [JP] Japan .................................. 1-136021
Jul. 10, 1989 [JP] Japan .................................. 1-175466

[51] Int. Cl.$^5$ .............................................. H01S 3/19
[52] U.S. Cl. ...................................... 372/45; 372/50; 357/4; 357/16; 357/17
[58] Field of Search ............... 372/50, 47, 43, 45; 357/4, 16, 17

[56] References Cited
U.S. PATENT DOCUMENTS

| | | | |
|---|---|---|---|
| 4,163,237 | 7/1979 | Dingle et al. | 357/16 |
| 4,250,515 | 2/1981 | Esaki et al. | 357/16 |
| 4,599,728 | 7/1986 | Alaivi et al. | 372/45 |
| 4,645,707 | 2/1987 | Davies et al. | 428/213 |
| 4,720,309 | 1/1988 | Deveaud et al. | 148/33.1 |
| 4,786,957 | 11/1988 | Muto | 357/34 |
| 4,872,038 | 10/1989 | Bernstein et al. | 357/4 |

FOREIGN PATENT DOCUMENTS

| | | | |
|---|---|---|---|
| 0238406 | 9/1987 | European Pat. Off. | 357/4 |
| 0284931 | 9/1988 | European Pat. Off. | |
| 0128562 | 6/1987 | Japan | 357/4 |
| 2131610 | 6/1984 | United Kingdom | |

OTHER PUBLICATIONS

Ballingall et al., Appl. Phys. Lett., 54 (21), May 22, 1989, "Novel Pseudomorphic High Electron Mobility Transistor Structures with GaAs-In$_{0.3}$Ga$_{0.7}$ As Thin Strained Superlattice Active Layers", pp. 2121-2123.
"Growth of a ZnSe-NzTe Strained-Layer Superlattice . . ." Kobayashi, et al., Appl. Phys. Lett. vol. 48 (4) Jan. 1986 p. 296.
"Semiconductor Heterojunction Topics: Introduction . . ." Milnes, A. G., Solid State Electronics, vol. 29 (2), 1986 pp. 99-121.
InGaAs-InP Multiple Quantum Wells Grown by Atmospheric Pressure Metalorganic Chemical Vapor Deposition, M. S. Skolnick, L. L. Taylor, S. J. Bass, A. D. Pitt, D. J. Mowbray, A. G. Cullis, and N. G. Chew, Royal Signals and Radar Establishment, St. Andrews Road, Great Malvern, Worcestershire WR 14 JPS, United Kingdom.
IEEE Journal of Quantum Electronics, vol. QE-24 (1988), pp. 1605-1613, Strained-Layer InGaAs-GaAs-AlGaAs Photopumped and Current Injection Lasers, Robert M. Kolbas, Member, IEEE, Neal G. Anderson, Member IEEE, W. D. Oaidig, Yongkun Sin, Y. C. Lo, K. Y. Hsieh, and Y. J. Yang.
Patent Abstracts of Japan, vol. 12, No. 38, Feb. 4, 1988; & JP 62-190886, Aug. 21, 1987.
Semiconductor Science & Technology, vol. 3, Oct. 1988, No. 10, pp. 1029-1036, M. Zachau: Photoconductivity in InGaAsP/InP Quantum Well Heterostructures—Inter-Sub-Band and Sub-Band-Continuum Transitions.

(List continued on next page.)

*Primary Examiner*—Georgia Y. Epps
*Attorney, Agent, or Firm*—Kenyon & Kenyon

[57] ABSTRACT

A semiconductor optical device having a region in which semiconductor or carriers in the semiconductor and light are interact, for example, an active region for a semiconductor laser, an optical wave guide region of an optical modulator, etc., includes a quantum well structure having a well region and a barrier region. The semiconductor optical device is remarkably improved with the degree of design freedom as it relates to parameters such as thickness and selection of material without deteriorating the quantum effect, by introducing a super lattice super-layer structure into the barrier region of the quantum well structure or defining the strain for the well region and the barrier region.

22 Claims, 7 Drawing Sheets

OTHER PUBLICATIONS

Siemens Forschungs- Und Entwicklungsberichte, vol. 15, No. 6, 1986, pp. 312–318, Berlin, DE; G. Abstreiter: Semiconductor Heterostructures.

Semiconductor Science and Technology, vol. 2, No. 11, Nov. 1987, pp. 705–709, London, GB; B. Lambert et al.: High-Mobility Vertical Transport in graded-Gap GaAs AlGaAs Superlattices.

Japanese Journal of Applied Physics, vol. 24, No. 6, Jun. 1985, pp. L405–L407, Tokyo, JP; K. Fujiwara et al.: Improved Heterointerface and Vertical Transport in GaAs Single Quantum Well Confined by All-Binary GaAs/AlAs Short-Period-Superlattices.

"Stimulated Emission in Strained-Layer Quantum-Well Heterostructures", M. D. Camras, J. Appln. Phys. vol. 54, No. 11, Nov. 1983 pp. 6183–6189.

"Realization of Both p- and n- Type Conduction for ZnSe-ZnTe Strained-Layer Superlattices", K. Kobasyashi et al., Applied Physics Letters, vol. 51, No. 20, 16 Nov. 1987, pp. 1602–1604.

"CRC Handbook of Chemistry and Physics", 62nd Edition, 1-1981-82, p. E-99 Table I: General Properties of Semi-Conductors.

Patent Abstracts of Japan, JP-A-63108782, vol. 12, No. 351, Sep. 20, 1988.

"$In_xGa_{1-y}As-In_yGa_{1-y}As$ Strained-Layer Super Lattices: A Proposal for Useful New Electronic Materials", G. C. Osbourn, The American Physcial Society, vol. 27, No. 8, Apr. 15, 1983 pp. 5126–6128.

"Principles and Applications of Semiconductor Strained-Layer Superlattices", G. C. Osbourn et al., Semi-Conductors and Semimetals, vol. 24, Chapter 8, pp. 459–503, 1-1987.

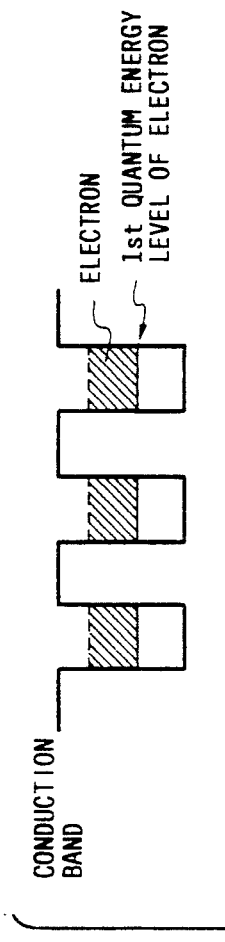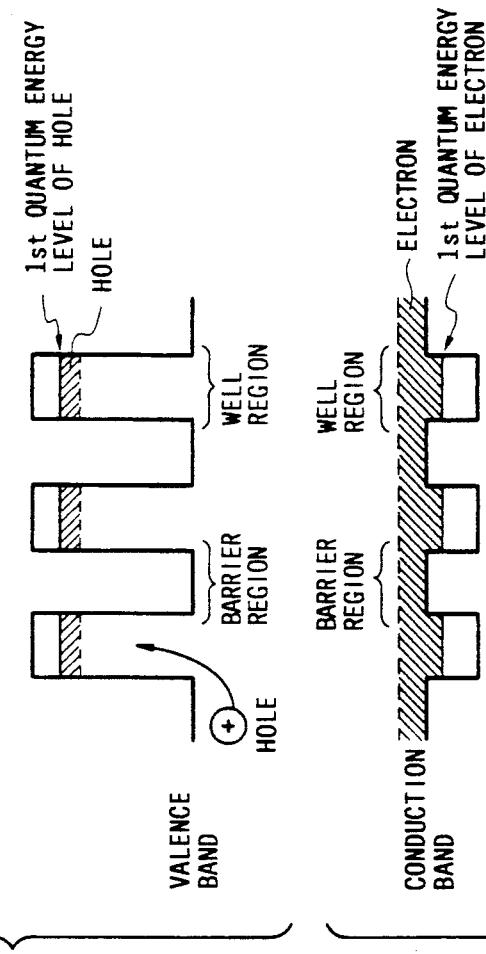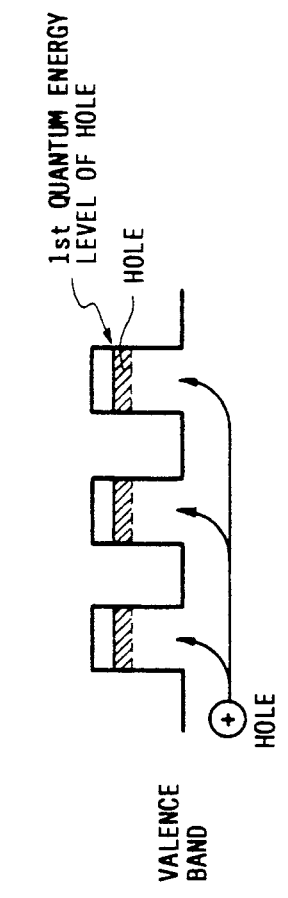

SEMICONDUCTOR OPTICAL DEVICE

BACKGROUND OF THE INVENTION

1. Field of the Invention

The present invention concerns a semiconductor optical device and, more particularly, it relates to a semiconductor optical device suitable for application to semiconductor laser devices and semiconductor light modulation devices used for optical fiber communication, optical information processing and optical measurement.

2. Description of the Related Art

A semiconductor optical device having a quantum well represented by MQW (multiple quantum well) lasers; has been noted as a fundamental technique in the optical communication in the next generation, in which effects such as an increase in the relaxation oscillation frequency, and a reduction in the spectral linewidth reflecting the quantum size effect are expected.

Values of the band-edge discontinuity energy in the quantum well region and the barrier region in conventional InGaAsP series QW (quantum well) lasers are greater on the side of the valence band than on the side of the conduction band. That is, in the QW structure using InGaAs(P) for the quantum well region and InP or InGaAsP for the barrier region, the well depth $\Delta Ec$ on the side of the conduction band is smaller than the well depth $\Delta Ev$ on the side of the valence band (that is $\Delta Ec < \Delta Ev$). Accordingly, the well depth sensed by electrons (effective well depth to the electrons) is shallower than the well depth sensed by holes (effective well depth to the holes). The ratio, i.e., the ratio of the value for the band-edge discontinuity energy, particularly, the value for the conduction band discontinuity:

$$\Delta Ec/(\Delta Ec + \Delta Ev)$$

is about from 0.3 to 0.4 in this system. As an example, it is described as 0.38 in Applied Physics Letters, Vol. 51 (1987), pages 24–26.

As in the prior art described above, in the Qw structure having a relationship: $\Delta Ev > \Delta Ec$, there is a problem that it is difficult to inject holes to each of the well regions.

This will be explained referring to band diagrams shown in FIG. 3A and 3B. Both of FIGS. 3A and 3B use InGaAs as the quantum well region, and InP is used in FIG. 3A and InGaAsP is used in FIG. 3B for the barrier region. Referring at first to FIG. 3A, the difference of the band gap between the quantum well region and the barrier region is large (about 610 meV) and $\Delta Ec$ is about 232 meV and $\Delta Ev$ is 378 meV. In this case, although electrons and holes are sufficiently quantitized, since $\Delta Ev$ is too great, the holes can be injected into the first well region but can not easily be injected into the second and the third well region, because the well depth on the side $\Delta Ev$ of the valence band is too great and the holes can not override it. This leads to a remarkable increase of a threshold current. In view of the above, the barrier region has been made of AnGaAsP for reducing $\Delta Ev$ (refer to FIG. 3B). Thus, the holes can be injected to each of the wells as shown in the figure, whereas the well depth $\Delta Ec$ on the side of the conduction band is also reduced. Then, the distribution of electrons with small effective mass exceeds the energy of the well region and electrons are not confined in the well region and are present as shown by the hatched line in FIG. 3B. Thus, the degree of electron quantitization is reduced and the quantum size effect of the quantum well can not fully be developed. In this case, although the threshold current is decreased, the quantum size effect is reduced to bring about a technical problem that the purpose of introducing the quantum well structure is defeated.

Further, in a semiconductor laser device using a laminated semiconductor structure having a quantum well, it has been known to provide a so-called strained super lattice structure utilizing the lattice constant mismatching of a semiconductor layer constituting the laminated semiconductor structure, for example, as disclosed in IEEE JOURNAL OF QUANTUM ELECTRONICS, Vol, QE-24 (1988), pages 1605–1613. In this prior art, if the degree of lattice mismatching, that is, the amount of strain is increased, dislocations occur making it impossible to form a semiconductor layer (quantum well region) having a thickness greater than a predetermined value which is referred to as a critical thickness. For instance, as shown by solid circles in FIG. 11, if the strain, that is, deviation of the lattice constant in the quantum well region relative to the lattice constant in the substrate is present in an amount of 2%, it is difficult to form a quantum well region having a thickness of greater than 100 Å and, if the strain is present in an amount of 4%, it is difficult to form a quantum well region having a thickness of greater than 40 Å. Generally, in the strained super lattice structure, optical properties are improved as the strain is increased as compared with a no-strain state. However, in the prior art, if the strain is increased, it correspondingly requires a reduction of the thickness of the quantum well region as described above. Accordingly, it is not possible to optionally and independently set the thickness and the strain for the quantum well region. Description will be made referring to a typical example. Now, considering intrusion of electrons to the barrier region, the range of the film thickness of the quantum well region for utilizing the quantum size effect most effectively is within a range about from 50 to 150 Å, but it is not possible in this case to introduce more than about 2% of strain (refer to FIG. 11). This remarkably hinders the degree of freedom for the design of the quantum well structure.

SUMMARY OF THE INVENTION

In accordance with one aspect of the present invention, there is provided a semiconductor optical device having a quantum well structure comprising a combination of a well region and a barrier region in which the band-edge discontinuity of the valence band is greater than the band-edge discontinuity of the conduction band, wherein the barrier region includes a super lattice thin-layer structure, and the lowest energy state of the mini-band formed to the barrier region with the super lattice-layer structure and the effective band-edge discontinuity formed by the well region are greater on the side of the conduction band than on the side of the valence band. Such a semiconductor optical device has a means, such as electrodes, for injecting electrons and holes (carriers) to the quantum well structure.

In the conventional InGaAs/InP or InGaAs/InGaAsP quantum well system, there is a trade-off relationship between the degree of the quantum size effect and the ease of injection of holes to each of the wells. This is attributable to that the well depth $\Delta Ev$ on the side of the holes with greater effective mass is greater than ΔEc. On the other hand, in GaAlAs/GaAs series, ΔEc is greater than ΔEv(ΔEc/(ΔEc+ΔEv)=0.7), in which there is no such trade-off relationship as described above. That is, for sufficiently utilizing the quantum size effect and facilitating the injection of the carriers (electrons, holes) to each of the well regions, it is ideal to make ΔEc on the side of electrons with less effective mass greater than ΔEv on the side of holes with larger effective mass. For intentionally creating a relationship: ΔEc>ΔEv in the material system originally having a relationship ΔEc<ΔEv, a super lattice thin-layer structure is introduced into the barrier region in the present invention, which is referred to as a super lattice-type quantum barrier. The super lattice thin-structure comprises a plurality kinds of (usually two kinds of) semiconductors of different band gaps laminated with each other. A typical form is a structure in which a plurality of well layers of small band gaps and a plurality of barrier layers of larger band gaps are alternately laminated periodically. The thickness for each of the layers, particularly, the thickness for the barrier layer is about less than 3 nm. Due to the thin layer thickness, the wave function of electrons and holes are bonded by means of tunnelling between each of semiconductor layers (well layers) of small band gaps. The structure is similar to the multiple quantum well structure, but the feature of the super lattice thin-layer structure is that the thickness for each of the layers is thin and the tunnelling effect is formed. This will be explained referring to the first band diagram. As an example, the quantum well region is made of InGaAs and the super lattice-type quantum barrier constituting the barrier region as a feature of the present invention comprises a periodical structure of the InGaAs well layers and InP barrier layers. As the typical value for the size of them, the thickness of the InGaAs quantum well region in which the electrons and the holes are localized is about from 5 to 15 nm so as to sufficiently develop the quantum-size effect. Further, the thickness of the InGaAs well layer forming the super-lattice type quantum barrier is about 0.6 to 3 nm and the thickness for the InP barrier layer is about from 0.6 to 3 nm. The feature of the present invention develops particularly remarkably within a range of repeating periods from about 2 to 10. However, only if the thickness for the well layer and the barrier layer is greater than 0.5 nm, can the effect of the present invention be attained sufficiently. In addition, when impurity (preferably p type) is doped at a high concentration ($1 \times 10^{18}$ cm$^{-3}$, preferably, greater than $2 \times 10^{19}$ cm$^{-3}$) to the entire barrier layer, or the super lattice-type quantum barrier forming the barrier layer, it synergistically functions with the improvement for the characteristics due to the modified doping effect, which is particularly preferred.

In accordance with another aspect of the present invention, there is provided a semiconductor optical device having:

a semiconductor substrate, a laminated semiconductor structure laminated on the semiconductor substrate and having an active region for emitting light by injected carriers and a resonant cavity for feeding back and simplifying the light emitted from the active region, and means for injecting the carriers into the active region, wherein the active region has a quantum well structure comprising a well region and a barrier region, and a super lattice thin-layer structure having a well layer and a barrier layer is disposed to the barrier region, so that injected carriers can be easily introduced into the well layer.

The resonant cavity may be formed by utilizing the two end faces of the device, but use of a constitution similar to a distributed feedback (DFB) laser or a distributed Bragg reflection (DBR) laser utilizing a so-called distributed feedback structure, such as of a grating disposed in the laminated semiconductor structure, is particularly preferred for the reduction of the spectral linewidth.

In accordance with still another aspect of the present invention, there is provided a semiconductor optical device comprising:

a semiconductor substrate and an optical region formed on the semiconductor substrate capable of interacting with light as an electromagnetic wave, wherein the optical region is constituted with a super lattice structure and the super lattice structure comprises a quantum well layer having a lattice constant greater than that of the semiconductor substrate and a barrier layer having a greater bandgap than that of the quantum well layer and a lattice constant smaller than that of the semiconductor substrate.

The optical region referred to herein means a region in which light and semiconductor, or carriers present in the semiconductor, interact to each other, for example, an active layer of a semiconductor layer, a wave guide layer of an optical wave guiding device, a variable refractive index region of an optical switch or an active region of an optical modulator. Further, the super lattice structure means a concept broader than the super lattice thinlayer structure as described previously, which is not restricted to those with layer thickness of less than 3 nm. Such a semiconductor optical device is includes a control means typically represented by electrodes for changing and controlling optical characteristics, e.g., refractive index, absorption coefficient, etc. of the optical region. An electric field or a current is applied to the optical region by the electrodes and the characteristics of the optical region vary depending on the degree thereof of field or current.

In accordance with a limited aspect of the present invention, there is provided a semiconductor optical device, wherein, when the amount of strain $\Delta a_w$ of the quantum well layer is defined as:

$$\Delta a_w \equiv (a_w - a)/a$$

in which a is the lattice constant of the semiconductor substrate and $a_w$ is the lattice constant of the quantum well layer and, when the amount of strain $\Delta a_b$ of the barrier layer is defined as:

$$\Delta a_b \equiv (a_b - a)/a$$

in which $a_b$ is the lattice constant of the barrier layer, $\Delta a_w$ and $\Delta a_b$ take positive and negative values respectively. For instance, $In_{0.5}Ga_{0.5}As$ quantum well layers ($a_w = 5.85$ Å, strain $\Delta a_w = +3.1\%$) and $GaAs_{0.3}P_{0.7}$ barrier layers ($a_b = 5.50$ Å $\Delta a_b = -2.2\%$) are successively laminated periodically on a GaAs substrate (lattice constant $a = 5.67$ Å). This can totally reduce the strain for the strained super lattice in the semiconductor optical device. By "totally reduce" it is meant that the positive strain in the quantum well layer and the negative strain in the barrier layer off set each other to thereby reduce the net strain in the entire super lattice.

However, if the quantum well layer and the barrier layer are considered individually, respective positive strain and negative strain are actually present.

It is desirable that the values for the positive and negative strains satisfy the following relationships:

$$0.005 < \Delta aw < 0.1$$

$$-0.1 < \Delta ab < -0.005$$

Within the above-mentioned range, band-mixing in the valence band, that is, interaction between heavy-hole and light-hole can remarkably be reduced in the present invention. Reduction in band-mixing can increase the interaction between light and carrier, that is, the ratio of stimulated emission or spontaneous emission for the laser oscillation, thereby improving the characteristics of the semiconductor optical device.

In accordance with a further limited aspect of the present invention, there is provided a semiconductor optical device in which $\Delta aw$ and $\Delta ab$ can satisfy the relationship:

$$\Delta aw + \Delta ab < 0.02$$

In this case, development of dislocations, etc. can be supperssed even if the thickness for the quantum well layer constituting the strained super lattice in the semiconductor optical device is increased.

In accordance with a further limited aspect of the present invention, there is provided a semiconductor optical device in which the optical region is constituted as an active layer of a semiconductor layer device.

The optical region emits light by recombination of electrons and holes stimulated by a current (injected carrier) from a control means such as electrodes disposed in connection with the device. Such a semiconductor optical device can oscillate at a low threshold level and obtain a high resonant frequency at a great output.

In accordance with a further limited aspect of the present invention, there is provided a semiconductor optical device in which the optical region is constituted, for example, as a variable refractive index region of an optical modulator such as an optical switch.

Such a semiconductor optical device enables a reduction of the size of the device without decreasing the effect (intensity) of the optical modulation. The semiconductor optical device is also includes a control means such as electrodes disposed in connection with device. For instance, an electric field or a current for varying the refractive index of the optical region is applied by the control means, thereby giving electric-optical effect or band filling effect to the light propagating in the optical region to realize optical modulation.

In accordance with a further limited aspect of the present invention, there is provided a semiconductor optical device having an optical region capable of interacting with light, in which the optical region is constituted with a super lattice structure and the super lattice structure includes a quantum well layer having a thickness greater than the critical thickness to the strain.

One advantage of the present invention is that a relationship: $\Delta Ec > \Delta Ev$ can be formed intentionally in the material system originally having a relationship: $\Delta Ec < \Delta Ev$. This can be applied, for example, to an InGaAs series QW structure, by which holes can be injected smoothly to each of the well layers while keeping a high quantum effect. As a result, it is possible to realize or attain a high quantum effect at a low threshold current (high relaxation oscillation frequency fr, low chirping) in a QW laser of material system: $\Delta Ec < \Delta Ev$.

Another advantage of the present invention is that the thickness of the quantum well layer can be increased in a state free from dislocations even when the strain is large in a semiconductor optical device using the strained super lattice in accordance with the present invention.

Accordingly, the degree of freedom in the design for the super lattice structure is greatly increased and, as a result, characteristics which can not be obtained sufficiently in the conventional strained super lattice can be utilized sufficiently, by which the oscillation threshold value of the semiconductor laser can be remarkably decreased, ultra high speed modulation is enabled and great wavelength tuning is obtained. Further, in an optical phase modulator, a short cavity is obtainable which has been difficult so far.

Still further advantages of the present invention will become apparent to those of the ordinary skill in the art upon reading and understanding the following detailed description of the preferred embodiments.

BRIEF DESCRIPTION OF THE DRAWINGS

The present invention may take form in various parts and arrangements of parts. The drawings are only for purpose of illustrating the preferred embodiments and are not to be construed as limiting the invention.

FIGS. 3A and 3B are band diagrams for a conventional QW structure.

DETAILED DESCRIPTION

Figure 1:
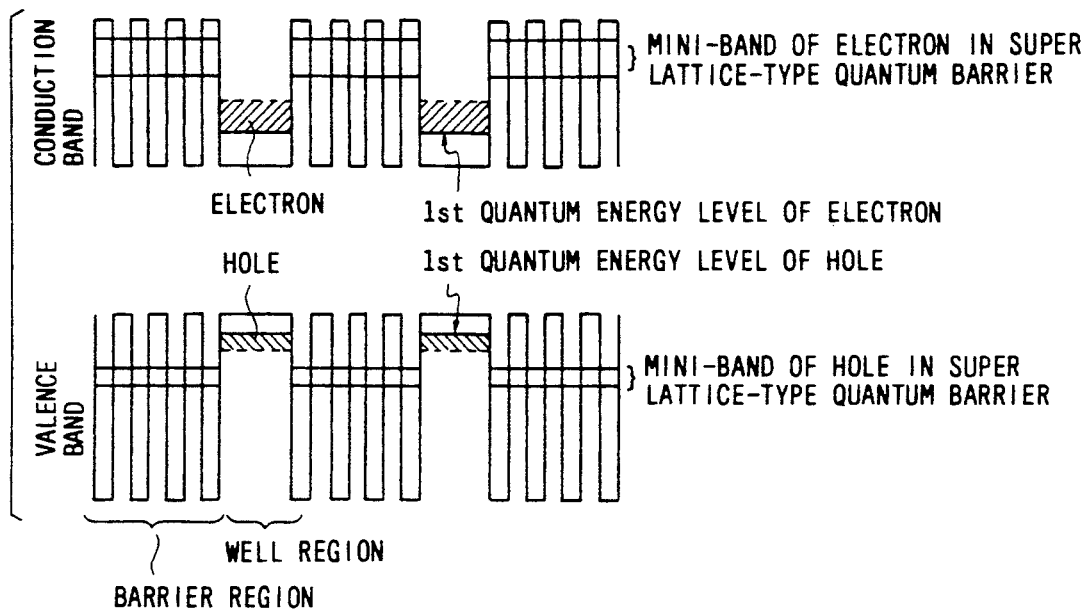
FIG. 1 is a view illustrating a band structure in principle for explaining a mini-band used in the present invention.
Figure 2:
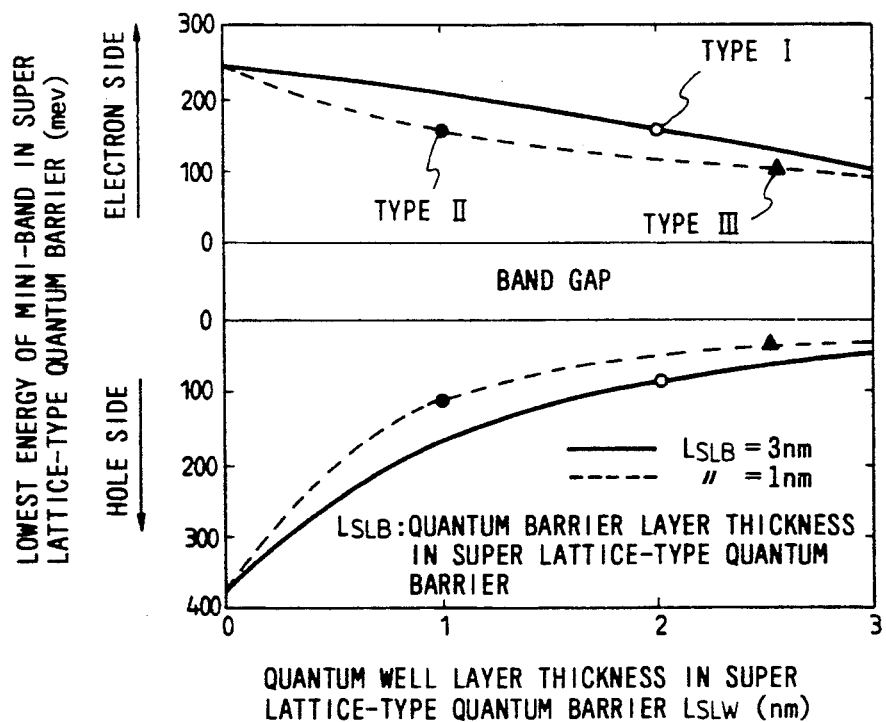
FIG. 2 is a graph illustrating a relationship between the lowest energy of the mini-band and a well layer.

Description will now be made at first to the mechanism for controlling $\Delta Ec$ and $\Delta Ev$ in accordance with the present invention using a super lattice-type quantum barrier referring to FIGS. 1 and 2. As shown in FIG. 1, a mini-band is formed for electrons and holes in the super lattice super-layer structure. The mini-band is a quantum energy level in the super lattice thin-layer structure, i.e., an energy band formed in the super lattice thin-layer structure. The energy of the mini-band in the super lattice-type quantum barrier forms the depth of well to the well region, that is, $\Delta Ec$ and $\Delta Ev$. The mini-band is formed by the coupling degree of the wave function between each of the well layers in the super lattice thin-layer structure and corresponds to the quantitized energy level in the super lattice thin-layer structure.

Now, the quantitizing energy level ΔE can be represented approximately as:

$$E \propto \frac{1}{mL^2}$$

in which m represents an effective mass and L represents a well layer thickness in the super lattice thin-layer structure. That is, the mini-band energy ΔE is in a reverse proportion with the effective mass. In InGaAs(P) series, the effective mass of electrons is about 1/10 of the effective mass of holes. Accordingly, the mini-band ΔEe for the electrons on the side of the conduction band, i.e., ΔEc, is greater by about ten times of the mini-band ΔEh for the holes on the side of the valence band, that is, ΔEv.

As described above, also in the system in which ΔEv is greater than ΔEc, a relationship ΔEc>ΔEv can be prepared by using the super lattice-type quantum barrier. This is attributable to the fact that electrons have a lower effective mass than holes and can be quantitized more easily. Explanations have been made qualitatively as above and FIG. 2 shows a result of an actual and exact calculation. In this calculation, a Kronig-Penny model used most generally in the calculation for the mini-band of the super lattice structure is used. In this case, InGaAs is used for the well and InP is used for the barrier in the super lattice structure, and the abscissa represents the thickness of the well and the variable parameter used is the thickness of the barrier. The point 0 on the abscissa represents so-called ΔEc and ΔEv of the material and it can be seen that (ΔEc/(ΔEc+ΔEv) is 0.38. Referring to typical value for ΔEc and ΔEv of the super lattice-type quantum barrier, it can be seen that ΔEc is sufficiently larger as: (ΔEc/(ΔEc+ΔEv) is 0.63 in the type I (well: 2 nm, barrier: 3 nm), the value is 0.59 in the type II (both well and barrier: 1 nm) and 0.69 in the type III (well: 2.5 nm, barrier: 1 nm). Further, when ΔEc of these types are measured by a C-V method, values substantially equal to the results of the calculation were obtained. In this way, a relationship: ΔEc>ΔEv can be attained for the first time in InGaAs(P) series. This can keep the quantum size effect sufficiently and facilitate the injection of the holes.

Figure 6:
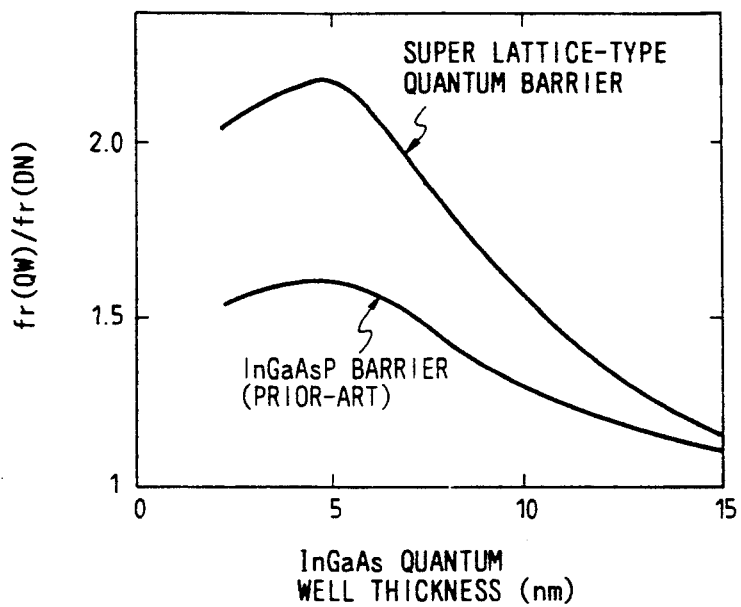
FIGS. 6 and 7 are views for explaining the effect of the present invention using a mini-band.

FIG. 6 shows the dependency of the relaxation oscillation frequency fr on the InGaAs quantum well width. In the figure, the ordinate represents a standardized value for fr of a DH (double hetero) laser. In this way, fr higher than twice can be expected in an InGaAs(P) series QW laser in accordance with the present invention.

The present invention will be described in detail referring to preferred embodiments.

EXAMPLE 1

Figure 4:
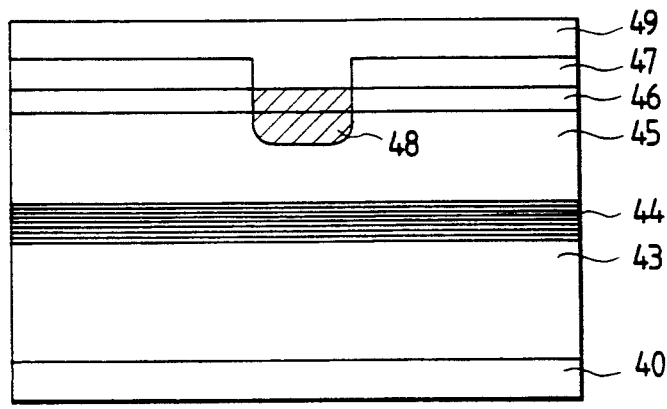
FIGS. 4, 5A, 5B and 8 are, respectively, views illustrating the cross sectional structure of one embodiment according to the present invention.

In FIG. 4, a multiple quantum well active layer 44, a p-InP clad layer 45 and an n-InP cap layer 46 are formed by crystal growth on an n-InP substrate 43 by means of an MOCDV process. In this example, the multiple quantum active layer 44 has a periodical structure comprising InGaAs quantum well layers as the well region and a super lattice-type barrier constituting a barrier region each having a layer thickness of 5 to 15 nm (period:−1-20). The super lattice-type quantum barrier is constituted with well layers comprising InGaAs or InGaAsP (λg>1.5 μm) with a thickness of 0.6 to 3 nm and a periodical structure of barrier layers comprising InP or InGaAsP (λg<1.15 μm) with a thickness of 0.6 to 3 nm (period: structure 2-20). Subsequently, a SiO₂ layer 47 is formed, partially removed and then diffused with Zn to form an impurity (Zn) diffusion layer 48, thereby preparing a stripe region (2-10 μm width). Then, a p-electrode 49 and an n-electrode 40 as carrier injection means are formed.

A plurality of such laminate structures are formed on a single wafer as a substrate which is then cleaved to obtain a plurality of device chips. In the case of a semiconductor laser, the cleaved surfaces of the device constitute two reflection surfaces of a resonant cavity for feeding back and amplifying light emitted from the active layers. The reflection surface may sometime be coated with a reflection membrane, a reflection-preventive membrane and surface protection layer.

The thus manufactured device has an extremely low threshold current of 10 to 20 mA due to the reduced ΔEv and has an extremely high relaxation oscillation frequency fr of about 30 GHz at 5 mW power due to the sufficient quantum size effect.

EXAMPLE 2

Figure 5A:
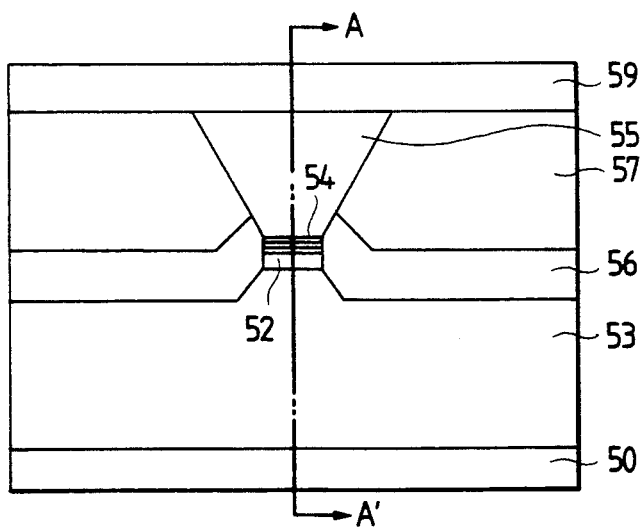
Figure 5B:
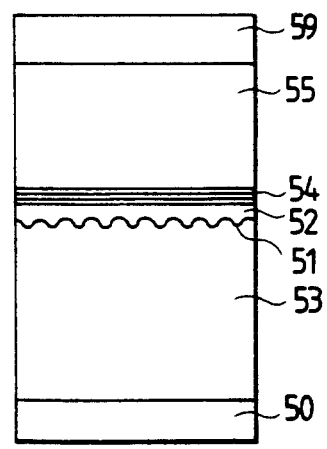

FIGS. 5A and 5B show an example in which the present invention is applied to a DFB laser device. In the DFB laser, the resonant cavity for feeding back and amplifying light emitted in the active layer has a distributed feed back structure (grating).

FIG. 5B is a cross sectional view of a device taken along line A-A' in FIG. 5A. An n-InGaAsP having a thickness of 0.05 to 0.25 μm (λg=1.1−1.3 μm) optical guide layer 52, a multiple quantum active layer 54 like that in Example 1 and a p-InP clad layer 55 are formed by means of crystal growth on an n-InP substrate 58 formed with a refractive grating, by using a gas source MBE process. Subsequently, a ridged stripe is formed passing through each of the grown layers and embedded with, a p-InP layer 56 and an n-InP layer 57. Then, a p-electrode 59 and an n-electrode 50 are formed. The active layer width is about 0.5 to 3 μm.

The thus manufactured device oscillates at a threshold current of 5 to 15 mA and shows a single longitudinal mode with a side mode suppression ratio of 50 dB. Further, fr at 5 mW is as high as about 30 GHz.

Figure 7:
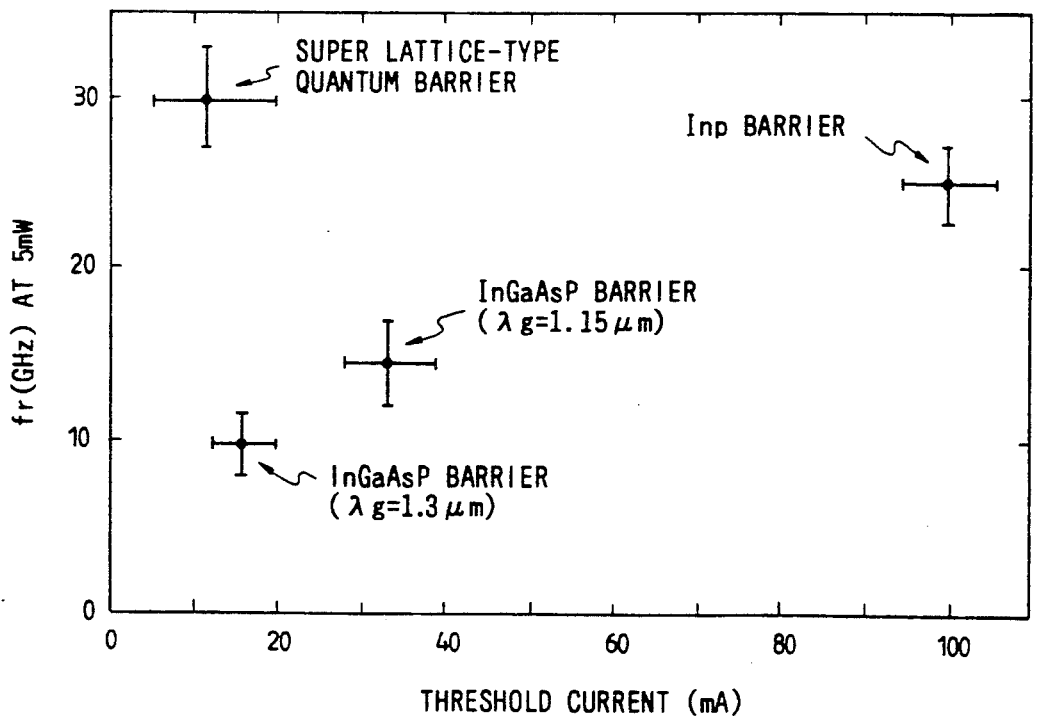

FIG. 7 shows the experimental values collectively for the threshold current and fr (at 5 nm) in various kinds of QW lasers. At first, in the case of an InP barrier region, although the Qw effect is large and fr is high (about 25 GHZ), since the injection of holes into each of the quantum wells is insufficient, the threshold current is as high as about 100 mA. On the other hand, in a QW laser using an InGaAsP barrier region with λg=1.3 μm, since ΔEv can be reduced, the holes can be injected easily into each of the quantum wells and the threshold current is low. However, ΔEc is low as well. As a result electrons are distributed over the barrier height energy to reduce the QW effect and fr is as low as 10 GHz. Further, a QW laser having an InGaAsP barrier region with λg==1.15 μm situates between them. That is, it has been impossible in the conventional system to simultaneously satisfy high fr and low threshold current. On the contrary, in the QW laser according to the present invention using the super lattice-type quantum barrier for the barrier region, high fr and low threshold voltage can be attained simultaneously for the first time. In addition, chirping under high speed modulation is as low as about 30% of the conventional QW laser.

EXAMPLE 3

Figure 8:
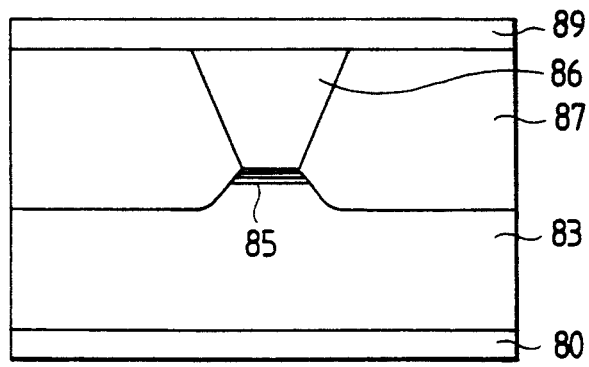

In FIG. 8, the same structure as that in Examples 1 and 2 is formed on an n-InP substrate 83. In this example, Zn is doped at $2 \times 10^{18}$ to $1 \times 12^{19}$ cm$^{-3}$ only to the super lattice-type quantum barrier, and a p-type modulation doped multiple quantum well active layer and a p-InP clad layer are formed by crystal growth by using an MOCVD process. Subsequently, a ridged stripe (0.5–3 μm as the active layer width) is formed and then is embedded with a semi-insulating Fe-doped InP layer and, further, p-electrode 89 and an n-electrode 80 are formed.

The capacitance of the thus manufactured device due to the introduction of semi-insulating InP and the resonant frequency fr can be 50 GHz due to the modulation doping effect and the QW effect.

EXAMPLE 4

Figure 9:
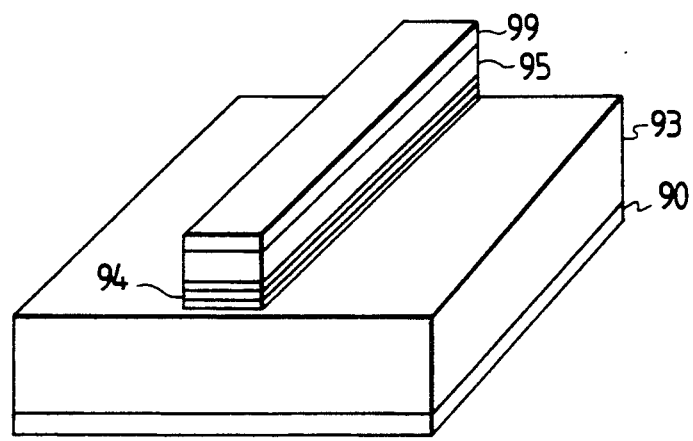
FIG. 9 is a perspective view for explaining the first embodiment according to the present invention.

Description will now be made to an embodiment in which the present invention is applied to a semiconductor optical phase modulator referring to FIG. 9. A multiple quantum well active layer 94 and a p-InP clad layer 95 like those of Examples 1 and 2 are successively grown on an n-InP substrate 93 which is part of a wafer a ridged stripe as shown in the figure is then formed to a typical width of 2 to 10 μm by means of etching. Subsequently, after forming a p-electrode 99 and n-electrode 90, the wafer is cleaved and isolated into individual devices.

A laser beam at a wavelength of 1.3 μ is injected on one end face of the thus manufactured optical phase modulator and the phase of light emitted from the optical phase modulator is controlled by varying the amount of the current injected to the p-electrode 99, that is, the amount of carriers injected to the multiple quantum well active layer 94. Since the variation of the refractive index of the optical phase modulator of this embodiment is as great as $5 \times 10^{-2}$ due to high QW effect, the length of the modulator for changing the phase by $\pi$ can be reduced to be about as short as 30 μm, which can not be attained in the prior art.

Further, it is of course possible to use the optical phase modulator in this example as a basic device such as for a Mach-Zehnder type modulator.

Description will then be made to the present invention using a strained super lattice. In the present invention, the value for the sum of the strain $\Delta aw$ of the well region (quantum well) and the strain $\Delta ab$ for the barrier region, that is, $\Delta aw + \Delta ab$ is defined as an effective strain (total strain). In the present invention, the strain for the total strained super lattice is reduced by setting the strain in the well region and that in the barrier region into opposite directions, that is, to positive and negative directions. However, in view of the strained super lattice, the effective strain applied to the well region is a value to the lattice constant of the barrier region, that is, the strain can be $\Delta aw - \Delta ab$. That is, it is possible to prevent the occurrence of dislocations by setting the strain for the well region larger in the strained super lattice, while setting the strain for the entire strained super lattice smaller.

Referring to a specific embodiment shown in FIG. 1, the effective strain $\Delta aw - \Delta ab$ for the well region can be set remarkably great as +5.3%, while the strain $\Delta aw + \Delta ab$ for the entire strained super lattice can be reduced considerably as +0.9%. As a result, a strained super lattice structure quite free from dislocations can be attained even with the well region with a thickness of 100 Å. On the other hand, in the conventional super lattice, if +5.3% strains is present, the critical thickness is extremely small, about 20 Å, which suggests the significant effect of the present invention.

The present invention will be described in more detail referring to preferred embodiments.

EXAMPLE 5

Figure 10:
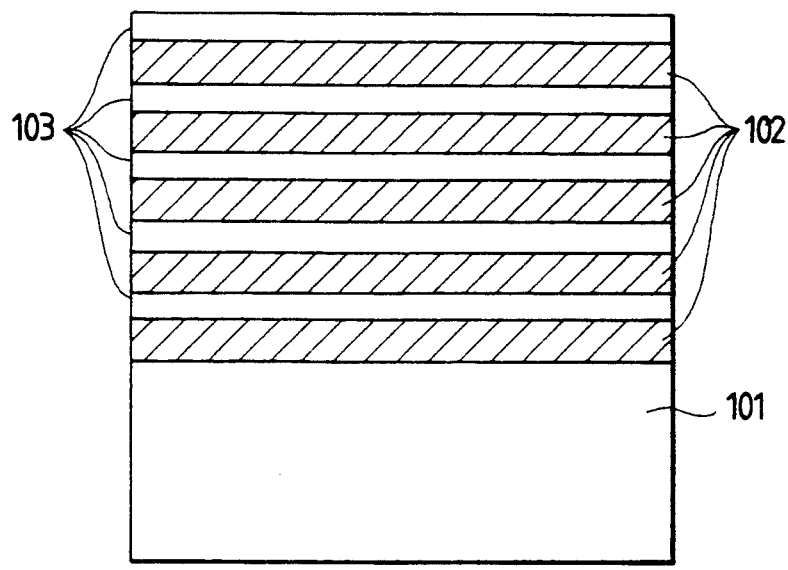
FIG. 10 is a schematic view for explaining the fundamental constitution of the present invention using a strained super lattice.
Figure 11:
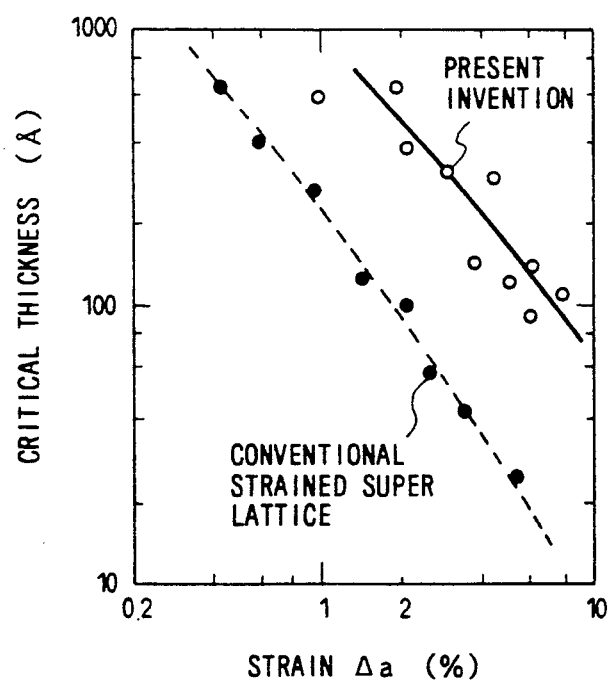
FIG. 11 is a view for explaining the effect of the present invention in comparison with the prior art.

FIG. 10 is a cross sectional view of a semiconductor optical device as one embodiment according to the present invention and FIG. 11 shows a result of experiments for preparing the strained super lattice according to the present invention.

As shown in FIG. 10, an In$_{0.5}$Ga$_{0.5}$As well region ($\Delta a = +3.1\%$) 102 and a GaAs$_{0.3}$P$_{0.7}$ barrier region ($\Delta a = -2.2\%$) 103 are successively grown periodically on a GaAs substrate 101 by using of a MOCVD process.

FIG. 11 shows a relationship between the effective strain and the critical thickness in the quantum well in this example. As shown in the example, the critical thickness, that is, the maximum quantum well thickness free from the dislocations can be increased by about 5 to 10 times as compared with the conventional strained super lattice. The relationship shown in FIG. 2 can be applied not only to the combination of the substrate, the well region and the barrier region in the example of FIG. 1 but also to general application. That is, similar improvements in critical thickness can be obtained also in any of the combinations comprising InP, GaAs or Si as the substrate and InGaAs, InGaAsP, InAsP, GaAlAs, GaInAsSb, InGaAlAs or InGaAlP as the well region and the barrier region.

EXAMPLE 6

Figure 12:
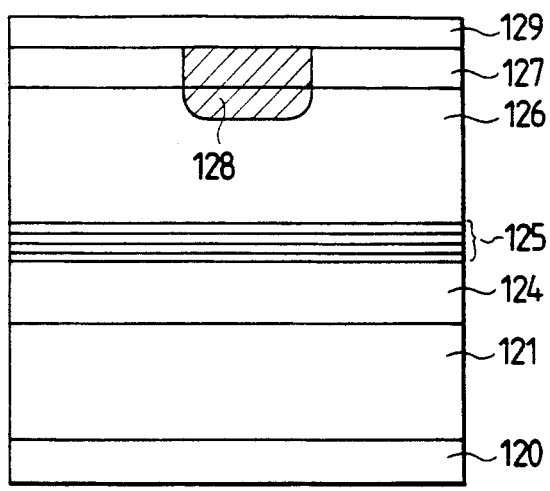
FIGS. 12 and 13 are, respectively, cross sectional structural views for explaining embodiments of semiconductor optical devices according to the present invention.

FIG. 12 shows an embodiment in which the present invention is applied to a semiconductor laser. After growing an n-GaAlAs clad layer 124 and a strained supper lattice active layer 125, a p-GaAlAs clad layer 126 and an n-GaAs layer 127 successively on an n-GaAs substrate 121 by using an MBE process, a current channel is formed by a Zn diffusion layer 128, and a p-electrode 129 and an n-electrode 120 are formed. The strained super lattice active layer 125 comprises a 5-periodical structure comprising an In$_{0.5}$Ga$_{0.5}$As well region with a thickness of 50 to 100 Å and a GaAs$_{0.3}$P$_{0.7}$ barrier region with a thickness of about 100 Å. Due to the strained super lattice structure, the laser characteristics show a low threshold value of about 1 mA and a resonant frequency as high as 30 GHz at an optical power of 5 mW, which is 5 to 6 times as great as that of the prior art.

EXAMPLE 7

Figure 13:
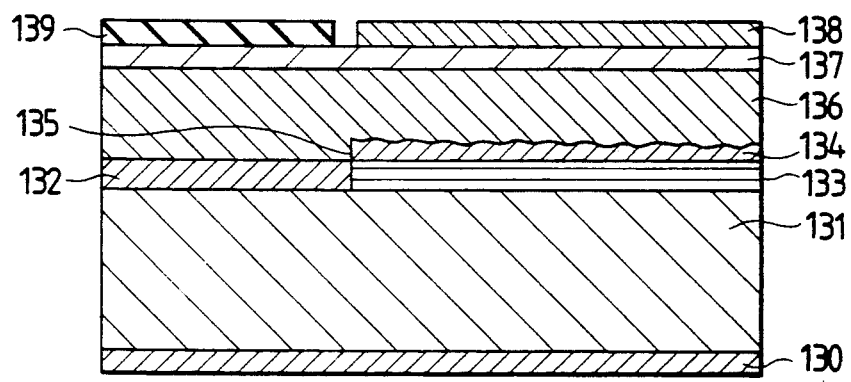

FIG. 13 shows one embodiment in which the present invention is applied to a wavelength tunable semiconductor laser. After forming an InGaAsP active layer 132 on an n-InP substrate 131 and forming a strained super lattice optical wave guiding layer 133 and an InGaAsP optical guide layer 134 to the external optical wave guide, a p-InP layer 136 and a p-InGaAsP contact layer 137 are grown successively by using an MOCVD process. Subsequently, a p-electrode 139, an n-electrode 130 and a wavelength tunable electrode 138 are formed.

The strained super lattice optical wave guiding layer 133 comprises a 2 to 10 periodical structure comprising an $InAs_{0.3}P_{0.7}$ region with a thickness of 50 to 150 Å (strain to InP: +2.2%) and a GaAs barrier region with a thickness of 50 to 150 Å (strain to InP: −3.6%).

When the amount of a current injected to the wavelength tunable electrode 138 of the thus manufactured device is changed, the refractive index of the strained super lattice optical wave guiding layer 133 changes and Bragg reflection wavelength due to the grating is changed and, as a result, the oscillation wavelength can be changed by 50 nm and the amount of change corresponds to about 10 times for the value of the conventional w-hetero structure. Further, the spectral linewidth is also reduced to obtain a value of about 200 KHz. The foregoing are the effects obtained by the strained super lattice structure.

In the embodiment of the semiconductor described above, it is of course possible to apply all of the types such as BH, Rib, etc. which are considered at present as the stripe structure.

EXAMPLE 8

Figure 14:
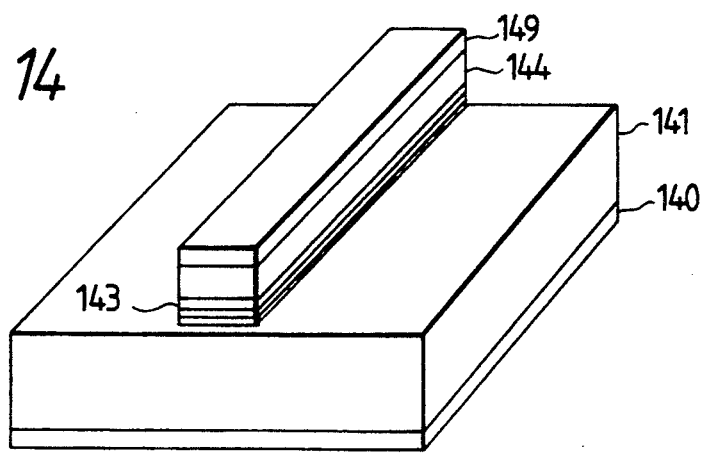
FIG. 14 is a perspective view for explaining a still further embodiment of the present invention.

FIG. 14 shows one embodiment in which the present invention is applied to a semiconductor optical phase modulator. After forming a strained super lattice layer 143 and a p-InP layer 144 on an n-InP substrate 142, a ridged stripe is formed to a width of 2 to 10 μm. Subsequently, a p-electrode 149 and an n-electrode 140 are formed. The strained super lattice layer 143 comprises an $Al_{0.05}Ga_{0.05}In_{0.9}As$ well region with a thickness of 30 to 120 Å (strain to InP: +2.2%) and an $Al_{0.1}Ga_{0.85}Al_{0.05}As$ barrier region (strain to InP: −3.1%) formed by 2 to 15 periods. A laser beam at a wave length of 1.55 μm is injected from one end face of the thus manufactured optical phase modulator and the amount of the current injected to the p-electrode 149 is varied to control the phase of the output light. The refractive index variation of this optical phase modulator is as large as $1 \times 10^{-1}$ due to the strained super lattice structure, and the length for the modulator for changing the phase by π can be reduced to be as short as about 15 μm, which has not previously been obtained.

The invention has been described with reference to a semiconductor laser device and a semiconductor modulation device. It is to be appreciated that other semiconductor optical devices are applicable, including semiconductor amplification device and the like.

The invention has been described with reference to the preferred embodiments. Obviously, modifications and alterations will occur to those of ordinary skill in the art upon reading and understanding the present invention. It is intended that the invention be construed as including all such alterations and modifications in so far as they come within the scope of the appended claims or the equivalent thereof.

What is claimed is:

1. A semiconductor optical device having a quantum well structure comprising a combination of a well region and a barrier region, in which the band-edge discontinuity of a valence band is greater than the band-edge discontinuity of a conduction band, wherein said barrier region includes a super lattice thin-layer structure and a lowest energy state of a mini-band formed to said barrier region by the super lattice thin-layer structure and an effective band-edge discontinuity formed by said well region are greater on the side of the conduction band than on the side of the valence band.

2. A semiconductor optical device as defined in claim 1, wherein the semiconductor device includes a means for injecting carriers into said quantum well structure.

3. A semiconductor optical device as defined in claim 1, wherein the super lattice thin-layer structure comprises a plurality of semiconductor layers each having a thickness of 5 to 30 Å.

4. A semiconductor optical device as defined in claim 1, wherein the barrier region includes a region doped with a conduction type impurity at a density of greater than $2 \times 10^{18}$ cm$^{-3}$ and lower than $1 \times 10^{19}$ cm$^{-3}$.

5. A semiconductor optical device comprising: a multiple quantum well structure having a plurality of well regions and barrier regions wherein a band-edge discontinuity of a valence band is greater than a band-edge discontinuity of a conduction band in the multiple quantum well structure, the barrier regions are formed with a super lattice thin-layer structure, and mobility of carriers between the well regions is increased by a mini-band formed within the super lattice thin-layer structure.

6. A semiconductor optical device having a multiple quantum well structure constituted with a plurality of well regions for the recombination and light emission of carriers and barrier regions for isolating such well regions, wherein said barrier region is constituted with a super lattice thin-layer structure comprising a plurality of semiconductor layers, so that carriers in said multiple quantum well structure move between said plurality of well regions by way of a mini-band formed at the inside of said super-lattice thin layer structure and wherein a band-edge discontinuity of a valence band is greater than a band-edge discontinuity of a conduction band in the multiple quantum well structure.

7. A semiconductor optical device as defined in claim 6, wherein injection of holes of the valence and into the well region is facilitated by making the effective band-edge discontinuity formed with said mini-band and said well region smaller on the side of the valence band than on the side of the conduction band.

8. A semiconductor optical device comprising:
   a semiconductor substrate,
   a laminated semiconductor structure laminated on said semiconductor substrate and having an active region for emitting light by injected carriers and a resonant cavity for feeding back and amplifying the light emitted from said active region, and
   a means for injecting the carriers into said active region, wherein
   said active region has a quantum well structure comprising a well region and as barrier region, and a super lattice thin-layer structure having well layers and barrier layers is disposed in the barrier region, wherein a band-edge discontinuity of a valence band is greater than a band edge discontinuity of a conduction band in the super lattice thin-layer structure, and the super lattice thin-layer structure forms an energy level so that injected carriers can be introduced easily into said well layer.

9. A semiconductor optical device as defined in claim 8, wherein the resonant cavity has a distributed feed back structure.

10. A semiconductor optical device comprising a semiconductor substrate and an optical region formed on said semiconductor substrate and capable of interacting with an electromagnetic wave, wherein the optical region includes a super lattice structure, and the super lattice structure has a quantum well layer having a lattice constant greater than that of said semiconductor substrate and a barrier layer having a bandgap greater than that of said quantum well layer and a lattice constant smaller than that of the semiconductor substrate.

11. A semiconductor optical device as defined in claim 10, wherein when the strain $\Delta aw$ for the quantum well layer is defined as:

$$\Delta aw \equiv (aw-a)/a$$

in which a is the lattice constant for the semiconductor substrate and aw is the lattice constant for the quantum well layer and when the strain ab for said barrier layer is defined as:

$$\Delta ab \equiv (ab-a)/a,$$

in which ab is the lattice constant for the barrier layer, the values $\Delta aw$ and $\Delta ab$ can respectively satisfy the following relationships:

$$0.005 < \Delta aw < 0.1$$

$$-0.1 < \Delta ab < -0.005.$$

12. A semiconductor optical device as defined in claim 11, wherein $\Delta aw$ and $\Delta ab$ can satisfy the relationship:

$$\Delta aw + \Delta ab < 0.02.$$

13. A semiconductor optical device as defined in claim 11, wherein the optical region has a multiple quantum well structure having the quantum well layers and the barrier layers successively laminated periodically.

14. A semiconductor optical device as defined in claim 10, wherein the optical region is an active region for emitting light, and said semiconductor optical device further comprises a clad region for confining light from said active region, an optical feed back means for feeding back the emitted light and a current injecting means for supplying a current to said active region for emitting light.

15. A semiconductor optical device as defined in claim 10, wherein the optical region is a wave guide region for propagating light and includes a grating at the vicinity thereof.

16. A semiconductor optical device as defined in claim 10, wherein the device comprises an activation means for emitting light and a an optical feed back means for transmitting light from said activation means and feeding back the light to said activation means, the optical feed back means comprises a wave guide region for propagating light, and a grating formed near said wave guide region for reflecting the propagated light and feeding it back to said activation means, and said wave guide region has said optical region.

17. A semiconductor optical device as defined in claim 10, wherein when the strain $\Delta aw$ for the quantum well layer is defined as:

$$\Delta aw \equiv (aw-a)/a$$

in which a is the lattice constant for the semiconductor substrate and aw is the lattice constant for the quantum well layer and when the strain ab for the barrier layer is defined as:

$$\Delta ab \equiv (ab-a)/a$$

in which ab is the lattice constant for the barrier layer, the values for $\Delta aw$ and $\Delta ab$ are, respectively, positive and negative values.

18. A semiconductor optical device as defined in claim 10, wherein the quantum well layer is formed directly on the semiconductor substrate.

19. A semiconductor optical device having an optical region capable of interacting with light wherein the optical region is constituted with a super lattice structure and said super lattice structure contains a quantum well layer having a thickness greater than the critical thickness to the strain.

20. A semiconductor device comprising:
a first semiconductor region having a first lattice constant;
a second semiconductor region having a second lattice constant; and
a third semiconductor region having a third lattice constant, wherein the second and the third semiconductor regions form a super lattice structure and the first lattice constant is smaller than the second lattice constant and larger than the third lattice constant; and
wherein a bandgap energy of the second semiconductor region is larger than that of the third semiconductor region so as to form a potential well.

21. The device as set forth in claim 20 wherein strain $\Delta aw$ of the second semiconductor region is defined as:

$$\Delta aw \equiv (aw-a)/a$$

in which a is the first lattice constant and aw is the second lattice constant, and strain $\Delta ab$ of the third semiconductor region is defined as:

$$\Delta ab \equiv (ab-1)/a$$

in which ab is the third lattice constant,
the values of $\Delta aw$ and $\Delta ab$ satisfy the following relationships:

$$0.005 < \Delta aw < 0.1$$

$$-0.1 < \Delta ab < -0.005,$$

22. The device as set forth in claim 21 wherein the values of aw and ab also satisfy the following relationship:

$$\Delta aw + \Delta ab < 0.02.$$

* * * * *

UNITED STATES PATENT AND TRADEMARK OFFICE
CERTIFICATE OF CORRECTION

Page 1 of 2

PATENT NO. : 5,132,981
DATED : July 21, 1992
INVENTOR(S) : Kazuhisa Uomi, et. al.

It is certified that error appears in the above-indentified patent and that said Letters Patent is hereby corrected as shown below:

On the Title page, item [57],

| Column | Line | |
|---|---|---|
| ABS. | 2 | Change "semiconductor" to --semiconductors-- (both occurrences). |
| ABS. | 3 | Delete "are". |
| 1 | 16 | After "lasers" delete ";". |
| 1 | 61 | Change "An-" to -- In- --. |
| 2 | 67 | After "to" insert --the fact--. |
| 3 | 15 | After "plurality" insert --of--. |
| 4 | 27 | Change "to" to --with--. |
| 4 | 35 | After "device" delete "is". |
| 4 | 61 | Change "Å$_\Delta$ab" to --Å $_\Delta$ab--. |
| 4 | 67 | Change "off set" to --offset--. |
| 5 | 26 | Change "supperssed" to --suppressed--. |
| 5 | 48 | Delete "is". |
| 5 | 50 | Before "device" insert --the--. |
| 6 | 58 | After "first" delete "to". |
| 8 | 36 | Before "optical" insert --, an--. |

UNITED STATES PATENT AND TRADEMARK OFFICE
CERTIFICATE OF CORRECTION

PATENT NO. : 5,132,981
DATED : July 21, 1992
INVENTOR(S) : Kazuhisa Uomi, et. al.

It is certified that error appears in the above-indentified patent and that said Letters Patent is hereby corrected as shown below:

| Column | Line | |
|---|---|---|
| 8 | 39 | After "substrate" change "58" to --53--. |
| 8 | 40 | After "grating" insert --51--. |
| 9 | 29 | After "wafer" insert --,--. |
| 9 | 30 | Change "a ridged" to --A ridged--. |
| 9 | 35 | Change "µ is" to --µ is--. |
| 10 | 1 | After "set" insert --as--. |
| 10 | 3 | Change "as" to --to--. |
| 10 | 7 | Change "is" to --are--. |
| 10 | 22 | Change "using" to --use--. |
| 10 | 43 | Change "supper" to --super--. |
| 12 | 36 | Change "and" to --band--. |
| 12 | 51 | Change "as" to --a--. |
| 13 | 50 | Before "an" delete "a". |

Signed and Sealed this

Twenty-sixth Day of October, 1993

*Attest:*

BRUCE LEHMAN

*Attesting Officer*  *Commissioner of Patents and Trademarks*